US010693108B2

(12) United States Patent
Kim et al.

(10) Patent No.: US 10,693,108 B2
(45) Date of Patent: Jun. 23, 2020

(54) ELECTROLUMINESCENT DISPLAY DEVICE

(71) Applicant: LG Display Co., Ltd., Seoul (KR)

(72) Inventors: Jin-Tae Kim, Paju-si (KR); Won-Hoe Koo, Paju-si (KR); Yong-Hoon Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/109,449

(22) Filed: Aug. 22, 2018

(65) Prior Publication Data

US 2019/0067642 A1 Feb. 28, 2019

(30) Foreign Application Priority Data

Aug. 31, 2017 (KR) ........................ 10-2017-0110949

(51) Int. Cl.
*H01L 51/52* (2006.01)
*H01L 27/32* (2006.01)

(52) U.S. Cl.
CPC ........ *H01L 51/5262* (2013.01); *H01L 27/322* (2013.01); *H01L 27/3246* (2013.01); *H01L 27/3258* (2013.01); *H01L 51/5206* (2013.01); *H01L 51/5275* (2013.01)

(58) Field of Classification Search
CPC ............. H01L 51/5262; H01L 27/3246; H01L 51/5206; H01L 51/5275; H01L 27/322; H01L 27/3258; H01L 27/3244; H01L 51/5271
See application file for complete search history.

(56) References Cited

U.S. PATENT DOCUMENTS 8,648,527 B2 * 2/2014 Shiobara ............ H01L 51/5284 313/503
2005/0073247 A1 * 4/2005 Yamazaki .......... H01L 27/3211 313/503
2013/0334507 A1 12/2013 Shimoji et al.
2014/0103308 A1 4/2014 Choi et al.

FOREIGN PATENT DOCUMENTS

CN 104934461 A 9/2015
CN 106486525 A 3/2017
CN 106803544 A 6/2017

OTHER PUBLICATIONS

China National Intellectual Property Administration, First Office Action, CN Patent Application No. 201810981198.4, dated Apr. 16, 2020, 20 pages.

* cited by examiner

*Primary Examiner* — Yasser A Abdelaziez
(74) *Attorney, Agent, or Firm* — Fenwick & West LLP

(57) ABSTRACT

A light extraction pattern is disposed in each hole of a first electrode, or a first electrode including round portions and pattern portions is disposed so that light trapped in an emission layer can be output uniformly. In this way, the light extraction efficiency can be effectively improved, and occurrence of a black area can be prevented.

12 Claims, 15 Drawing Sheets

100
D
141 142 143
CP H
a c b
136
132
160
150
133
131
110
124 122 121 123
120

ELECTROLUMINESCENT DISPLAY DEVICE

CROSS-REFERENCE TO RELATED APPLICATIONS

This application claims priority to and the benefit of Republic of Korea Patent Application No. 10-2017-0110949, filed on Aug. 31, 2017, in the Republic of Korea Intellectual Property Office, which is incorporated herein by reference in its entirety.

BACKGROUND

1. Technical Field

The present disclosure relates to an electroluminescent display device, and more particularly, to an electroluminescent display device capable of improving light extraction efficiency.

2. Discussion of the Related Art

Recently, flat panel displays having excellent characteristics such as being thin, lightweight and low power consumption have been widely developed and applied to various fields.

Among the flat panel displays, an electroluminescent display device is a device in which a charge is injected into an emission layer formed between a cathode, which is an electron-injecting electrode, and an anode, which is a hole-injecting electrode, such that excitons are formed, and then radiative recombination of the excitons occurs such that light is emitted.

The electroluminescent display device is able to be formed even on a flexible substrate such as plastic and has an advantage in a contrast ratio due to being a self-emitting type. In addition, the electroluminescent display device is able to easily realize a dynamic image due to having a response time of about several microseconds (μs) and has no limit in a viewing angle. Moreover, the electroluminescent display device is stable even at a low temperature, and is able to be driven at a relatively low voltage of DC 5 V to 15 V such that it is easy to manufacture and design a drive circuit.

FIG. 1 is a schematic cross-sectional view of a conventional electroluminescent display device.

As illustrated in FIG. 1, an electroluminescent display device 1 includes a substrate 10, a thin film transistor Tr disposed on the substrate 10 and a light emitting diode D disposed above the substrate 10 and connected to the thin film transistor Tr. The electroluminescent display device may further include an encapsulation layer (not shown) disposed above the light emitting diode D.

The light emitting diode D includes a first electrode 41, an emitting layer 42, and a second electrode 43, and light from the emitting layer 42 is output to the outside through the first electrode 41.

The light emitted from the emitting layer 42 passes through various configurations of the electroluminescent display device 1 and exits the electroluminescent display device 1.

However, a surface plasmon component generated at a boundary between a metal and the emitting layer 42 and an optical waveguide mode, which is configured by the emitting layer 42 inserted into reflective layers at both sides, accounts for about 60 to 70% of emitted light.

Accordingly, among light emitted from the emitting layer 42, light that are trapped in the electroluminescent display device 1 instead of exiting the electroluminescent display device 1 are present. Thus, there is a problem in that light extraction efficiency (out-coupling efficiency) of the electroluminescent display device 1 is degraded.

SUMMARY

Accordingly, the present invention is directed to an electroluminescent display that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, the present disclosure provides an electroluminescent display device including an overcoat layer above a substrate; a first electrode on the overcoat layer and including a plurality of holes exposing the overcoat layer; at least one light extraction pattern in at least one of the plurality of holes and on the overcoat layer; an emission layer on the first electrode and the at least one light extraction pattern; and a second electrode on the emission layer.

In another aspect, the present disclosure provides an electroluminescent display device including a substrate including an emission area; an overcoat layer on the substrate and including a plurality of protruding portions in the emission area; a first electrode on the overcoat layer and including round portions and pattern portions, wherein the round portions respectively corresponds to the plurality of protruding portions, and the pattern portions are disposed between the round portions; an emission layer on the first electrode; and a second electrode on the emission layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

Hereinafter, exemplary embodiments of the present disclosure will be described with reference to the accompanying drawings.

Figure 1:
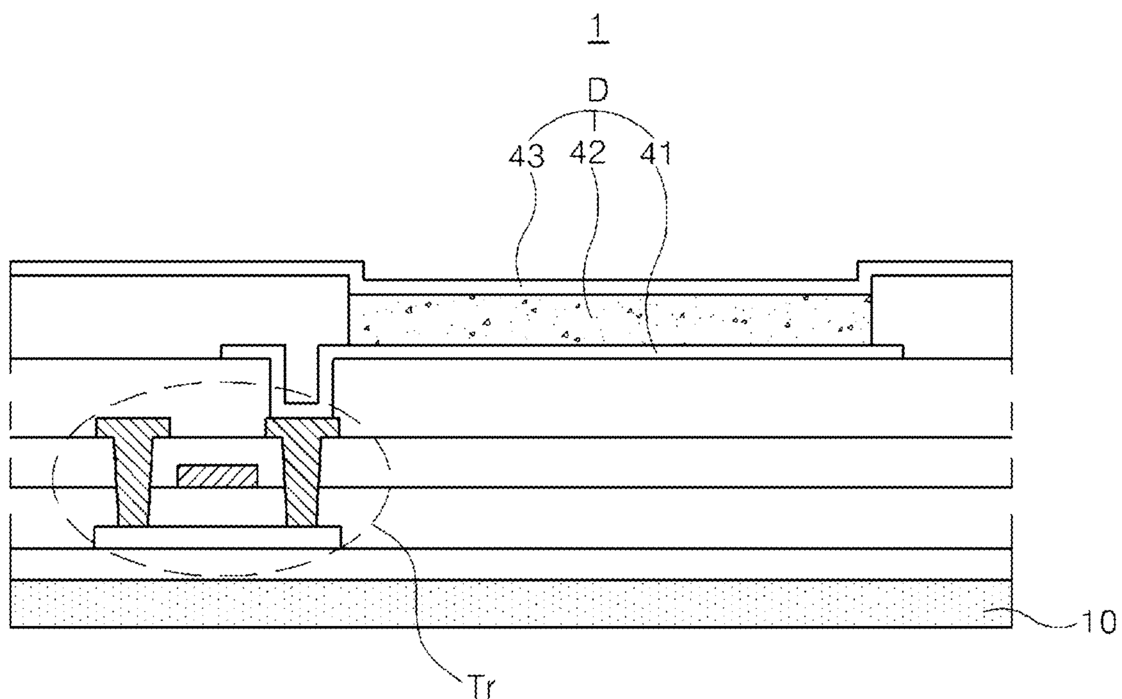
FIG. 1 is a cross-sectional view schematically illustrating a conventional electroluminescent display device.
Figure 2:
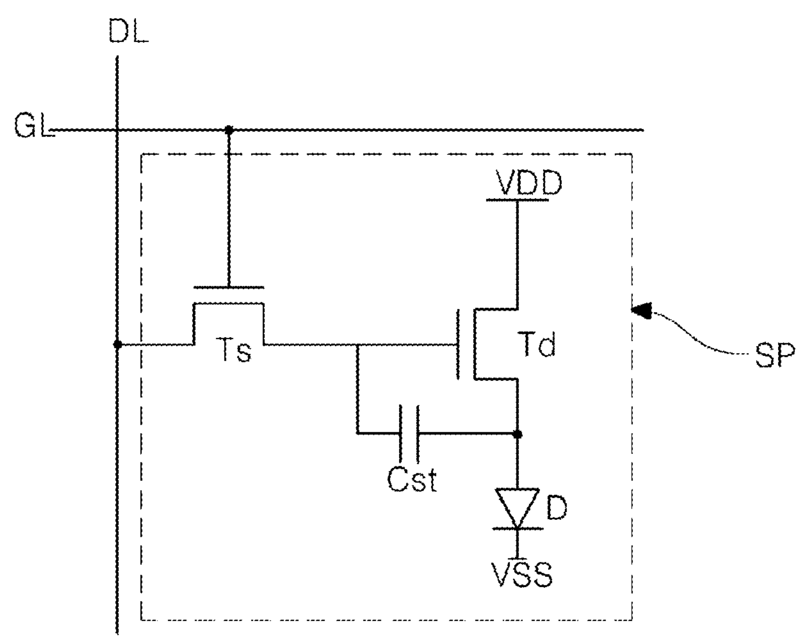
FIG. 2 is a circuit diagram illustrating a single subpixel area of an electroluminescent display device according to an embodiment of the present disclosure.

FIG. 2 is a circuit diagram illustrating a single subpixel area of an electroluminescent display device according to an embodiment of the present disclosure.

As illustrated in FIG. 2, the electroluminescent display device according to an embodiment of the present disclosure includes a gate line GL and a data line DL crossing each other to define a subpixel region SP. A switching thin film transistor Ts, a driving thin film transistor Td, a storage capacitor Cst, and a light emitting diode D are formed in each subpixel region SP.

A gate electrode of the switching thin film transistor Ts is connected to the gate line GL, and a source electrode of the switching thin film transistor Ts is connected to the data line DL. A gate electrode of the driving thin film transistor Td is connected to a drain electrode of the switching thin film transistor Ts, and a drain electrode of the driving thin film transistor Td is connected to a high-potential voltage VDD. An anode of the light emitting diode D is connected to a source electrode of the driving thin film transistor Td, and a cathode is connected to a low-potential voltage VSS. The storage capacitor Cst is connected to the gate electrode and the source electrode of the driving thin film transistor Td.

In an image display operation of such an electroluminescent display device, the switching thin film transistor Ts is turned on in accordance with a gate signal applied through the gate line GL, and a data signal applied to the data line DL is applied to the gate electrode of the driving thin film transistor Td and one electrode of the storage capacitor Cst through the switching thin film transistor Ts.

The driving thin film transistor Td is turned on in accordance with the data signal and controls a current which flows in the light emitting diode D so as to display an image. The light emitting diode D emits light due to a current of the high-potential voltage VDD transmitted through the driving thin film transistor Td.

That is, since an amount of current in the light emitting diode D is proportional to an amplitude of the data signal, and an intensity of light emitted by the light emitting diode D is proportional to the amount of current in the light emitting diode D, the subpixel region SP displays a grayscale, which differs in accordance with the amplitude of the data signal, and as a result, the electroluminescent display device displays an image.

The storage capacitor Cst serves to maintain a charge which corresponds to the data signal during one frame in order to make an amount of current flowing in the light emitting diode D constant and maintain a grayscale, which the light emitting diode D displays, to be constant.

A transistor and/or a capacitor other than the switching and driving thin film transistors Ts and Td and the storage capacitor Cst may be further added in the subpixel region SP.

Figure 3:
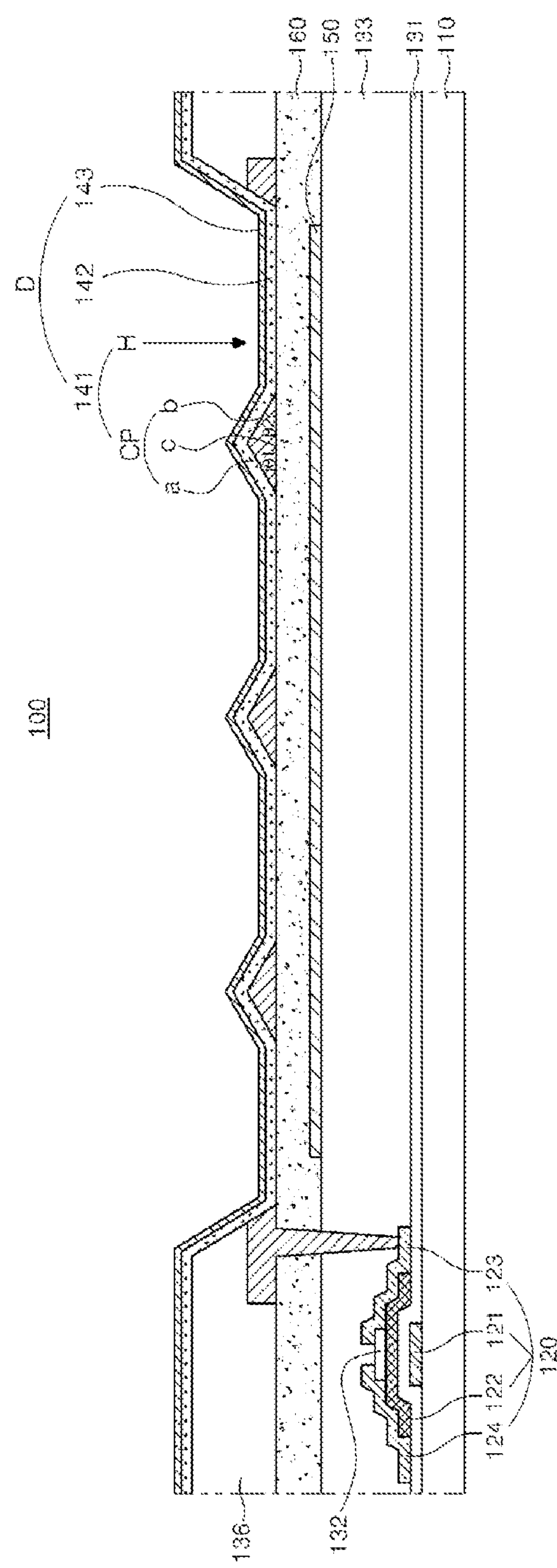
FIG. 3 is a schematic cross-sectional view illustrating an electroluminescent display device according to a first embodiment of the present disclosure.

FIG. 3 is a schematic cross-sectional view illustrating an electroluminescent display device according to a first embodiment of the present disclosure.

As illustrated in FIG. 3, an electroluminescent display device 100 according to the first embodiment of the present disclosure may include a substrate 110, a thin film transistor 120, a color filter pattern 150, an overcoat layer 160, and a light emitting diode D electrically connected to the thin film transistor 120.

The electroluminescent display device 100 according to the first embodiment of the present disclosure is illustrated as being a bottom emission type in which light from an emission layer 142 is output to the outside through a first electrode 141, but embodiments are not limited thereto.

That is, the electroluminescent display device 100 according to the first embodiment of the present disclosure may also be a top emission type in which the color filter pattern 150 is located opposite the substrate 110 and light from the emission layer 142 is output to the outside through a second electrode 143.

When the electroluminescent display device 100 is the top emission type, a reflective electrode or a reflective layer may be further formed below the first electrode 141. For example, the reflective electrode or the reflective layer may be formed of an aluminum-palladium-copper (APC) alloy. In this case, the second electrode 143 may have a relatively small thickness for light to transmit therethrough.

The electroluminescent display device 100 according to the first embodiment of the present disclosure may include, on the substrate 110, a thin film transistor 120 which includes a gate electrode 121, an active layer 122, a source electrode 123, and a drain electrode 124.

Specifically, the gate electrode 121 of the thin film transistor 120 and a gate insulating layer 131 may be disposed on the substrate 110.

The active layer 122, which overlaps the gate electrode 121, may be disposed on the gate insulating layer 131.

An etch stopper 132 for protecting a channel area of the active layer 122 may be disposed on the active layer 122.

The source electrode 123 and the drain electrode 124, which come into contact with the active layer 122, may be disposed on the active layer 122.

The electroluminescent display device 100 to which the first embodiment of the present disclosure is applicable is not limited to that illustrated in FIG. 3. The electroluminescent display device 100 may further include a buffer layer disposed between the substrate 110 and the active layer 122, and the etch stopper 132 may not be disposed thereon.

For convenience of description, only the driving thin film transistor has been illustrated from among various thin film transistors that may be included in the electroluminescent display device 100. Although the thin film transistors 120 will be described as having an inverted staggered structure or bottom gate structure in which, with respect to the active layer 122, the gate electrode 121 is disposed opposite the source electrode 123 and the drain electrode 124, this is merely an example, and a thin film transistor, which has a coplanar structure or top gate structure in which, with respect to the active layer 122, the gate electrode 121 is disposed to be collinear with the source electrode 123 and the drain electrode 124, may also be used.

A protective layer 133 may be disposed on the drain electrode 124 and the source electrode 123, and the color filter pattern 150 may be disposed above the protective layer 133.

The protective layer 133 is illustrated to have a flat top surface. Alternatively, the protective layer 133 may also be disposed along the shapes of surfaces of configurations located below the protective layer 133.

The color filter pattern 150 is configured to change a color of light emitted from the emission layer 142, and may be one of a red color filter pattern, a green color filter pattern, and a blue color filter pattern.

The color filter pattern 150 may be disposed at positions which correspond to an emission area and may be disposed only at portions of the emission area.

Emission area refers to an area in which the emission layer 142 emits light by the first electrode 141 and the second electrode 143, and the color filter pattern 150 being disposed at a position corresponding to the emission area means that the color filter pattern 150 is disposed to prevent a blurring phenomenon and a ghost phenomenon which occur due to mixing of light emitted from adjacent emission areas.

For example, the color filter pattern 150 may be disposed to overlap the emission area and have a size smaller than or equal to that of the emission area.

However, the arrangement position and size of the color filter pattern 150 may be determined by various factors such as a distance between the color filter pattern 150 and the first electrode 141, a distance between the color filter pattern 150 and the overcoat layer 160, and a distance between the emission area and a non-emission area, as well as the size and position of the emission area.

Figure 17:
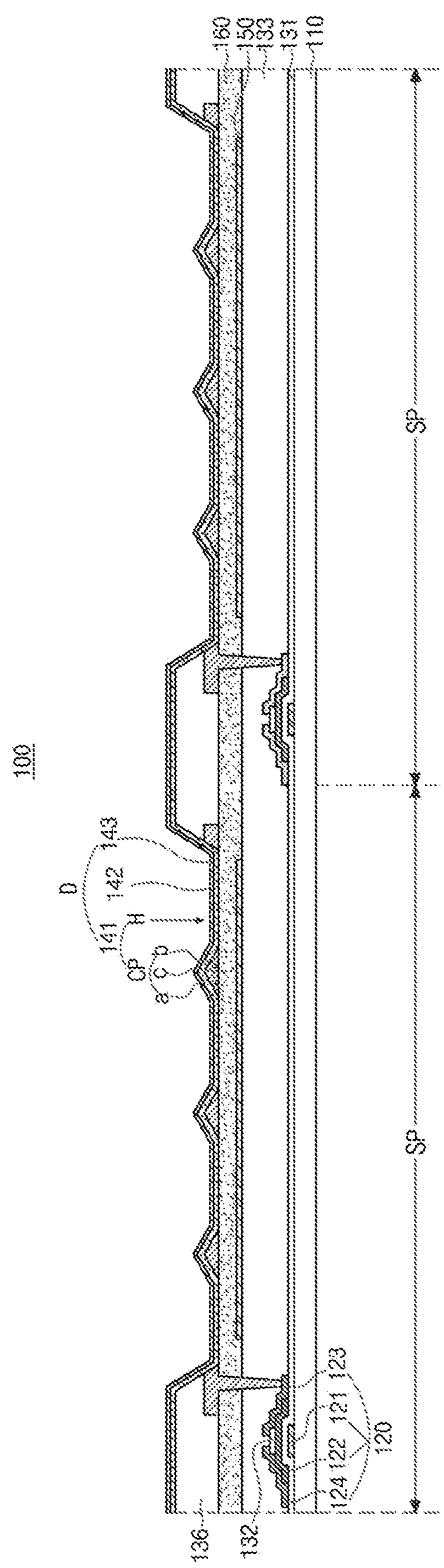
FIG. 17 is a schematic cross-sectional view illustrating a plurality of subpixel regions of the electroluminescent display device according to an embodiment of the present disclosure.

A pixel of the present disclosure may include one or more subpixels. For example, a single pixel may include two to four subpixels. As shown in FIG. 17, two adjacent subpixel regions SP are provided.

Subpixel refers to a unit in which a specific type of color filter pattern 150 is formed or in which the light emitting diode D is capable of emitting a particular color without the color filter pattern 150.

Colors defined in a subpixel may include red (R), green (G), blue (B), and optionally white (W), but embodiments are not limited thereto.

The overcoat layer 160 may be disposed on the color filter pattern 150 and the protective layer 133.

The protective layer 133 may be omitted. That is, the overcoat layer 160 may be disposed on the thin film transistor 120.

The color filter pattern 150 is illustrated as being disposed on the protective layer 133, but embodiments are not limited thereto. The color filter pattern 150 may be disposed at any position between the overcoat layer 160 and the substrate 110.

The light emitting diode D including the first electrode 141, the emission layer 142, and the second electrode 143 may be disposed on the overcoat layer 160.

The first electrode 141 of the electroluminescent display device 100 according to the first embodiment of the present disclosure may include a plurality of holes H. A surface of the overcoat layer 160 is exposed though the hole H.

That is, the exposed first electrode 141 may include a bottom surface which comes into contact with the overcoat layer 160 and a top surface which is disposed opposite the bottom surface.

Each of the plurality of holes H may be formed to pass through the bottom surface and the top surface of the first electrode 141.

An area of each of the plurality of holes H may progressively increase from the bottom surface to the top surface of the first electrode 141.

Accordingly, connecting portions CP each having a triangular cross-section may be disposed between neighboring holes H.

Each of the connecting portions CP may include an undersurface "c" and first and second inclined surfaces "a" and "b" which are connected to the undersurface "c."

A first angle θ1 formed between the undersurface "c" and the first inclined surface "a" and a second angle θ2 formed between the undersurface "c" and the second inclined surface "b" may be equal to each other, but embodiments are not limited thereto. The first angle θ1 and the second angle θ2 may also be different from each other.

In this case, when the first angle θ1 and the second angle θ2 are less than 15°, the light extraction efficiency may be low, and when the first angle θ1 and the second angle θ2 exceed 70°, an angle at which light, which begins to travel from a valid emission area, travels is 42° or larger such that the light is trapped inside the light emitting diode D and the light extraction efficiency cannot be improved. Therefore, the first angle θ1 and the second angle θ2 may be in the range of 15° to 70°.

To block the spread of outgassing from the overcoat layer 160 to the light emitting diode D, a second protective layer (not shown) which has an insulating property may be disposed between the overcoat layer 160 and the first electrode 141.

In this case, the first electrode 141 may be an anode or cathode for supplying one of electrons or holes to the emission layer 142.

A case in which the first electrode 141 of the electroluminescent display device 100 according to the first embodiment of the present disclosure is an anode will be described as an example.

The first electrode 141 may be formed of an amorphous metal oxide. For example, the amorphous metal oxide may include any one selected from the group consisting of indium zinc oxide (IZO), zinc tin oxide (ZTO), tin oxide ($SnO_2$), zinc oxide (ZnO), indium oxide ($In_2O_3$), gallium indium tin oxide (GITO), indium gallium zinc oxide (IGZO), zinc indium tin oxide (ZITO), indium gallium oxide (IGO), gallium oxide ($Ga_2O_3$), aluminum zinc oxide (AZO), and gallium zinc oxide (GZO).

The first electrode 141 may be connected to the source electrode 123 of the thin film transistor 120 through a contact hole formed in the overcoat layer 160 and may be separately formed in each pixel area.

In the electroluminescent display device 100 according to the first embodiment of the present disclosure, the thin film transistor 120 is an N-type thin film transistor in which the first electrode 141 is connected to the source electrode 123, but embodiments are not limited thereto. When the thin film transistor 120 is a P-type thin film transistor, the first electrode 141 may also be connected to the drain electrode 124.

The first electrode 141 may also be electrically connected to the emitting layer 142 by being adjacent to the emitting layer 142 with a conductive material therebetween.

A bank layer 136 may be disposed on the overcoat layer 160 and the first electrode 141.

The bank layer 136 may include an opening configured to expose the first electrode 141.

The bank layer 136 may be disposed between adjacent pixel (or subpixel) areas and serve to differentiate the adjacent pixel (or subpixel) areas.

The emission layer 142 may be disposed on the first electrode 141.

The emission layer 142 may have a tandem white structure in which a plurality of emission layers are stacked to emit white light.

For example, the emission layer 142 may include a first emission layer configured to emit blue light and a second emission layer disposed on the first emission layer and configured to emit light having a color which turns white when mixed with blue.

The second emission layer may be an emission layer configured to emit yellow-green light.

The emission layer 142 may only include emission layers that emit one of blue light, red light, and green light. In this case, the electroluminescent display device 100 may not include the color filter pattern 150.

In this case, an emitting material of the emitting layer 142 may be an organic emitting material or an inorganic emitting material, such as a quantum dot.

Also, the emission layer 142 may be disposed along the shape of the first electrode 141.

That is, the emission layer 142 may be disposed along the shape of the first electrode 141 including the plurality of holes H.

The second electrode 143 for supplying one of electrons or holes to the emission layer 142 may be disposed on the emission layer 142.

In this case, the second electrode 143 may be an anode or a cathode.

A case in which the second electrode 143 of the electroluminescent display device 100 according to the first embodiment of the present disclosure is a cathode will be described as an example.

The second electrode 143 may be formed of a conductive material having a relatively low work function value and may be located on an entire surface of a display area. For example, the second electrode 143 may be formed of aluminum (Al), magnesium (Mg), silver (Ag), or an alloy thereof, but embodiments are not limited thereto.

The second electrode 143 is disposed in a shape which follows the morphology of the emission layer 142.

The first electrode 141, the emission layer 142, and the second electrode 143 form the light emitting diode D.

That is, the emission layer 142 and the second electrode 143 are disposed in shapes which follow the morphology of the top surface of the first electrode 141. Consequently, the emission layer 142 and the second electrode 143 have concave morphology at the holes H of the first electrode 141 and have convex morphology at the connecting portions CP.

In this way, the shape of the light emitting diode D may be realized using the plurality of holes H of the first electrode 141 and the connecting portions CP.

Figure 4:
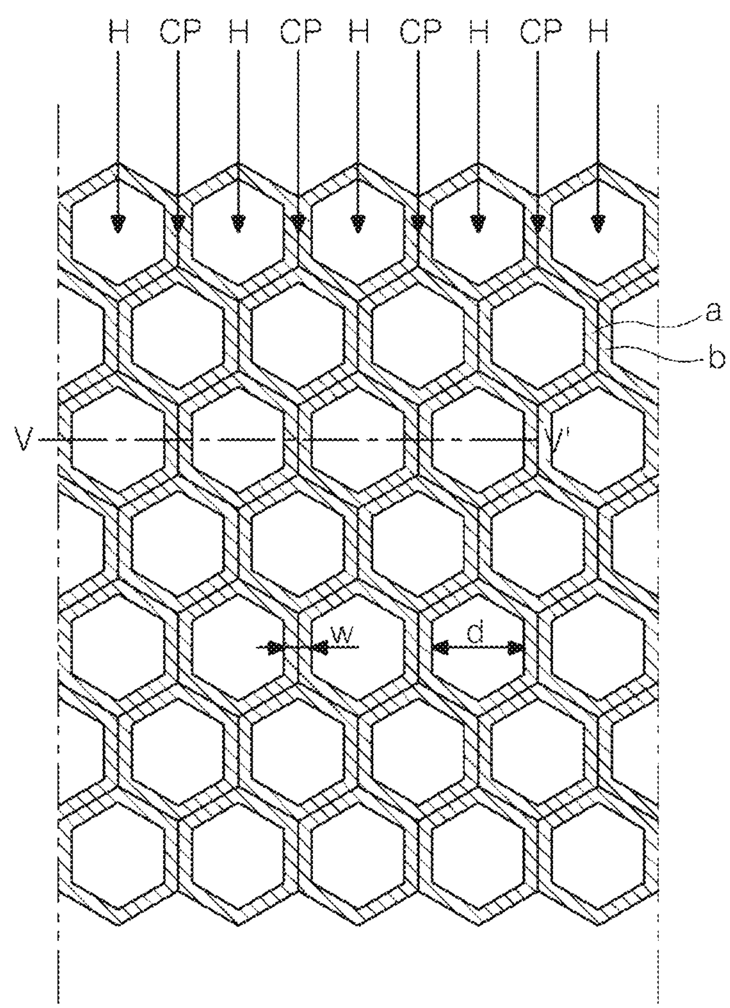
FIG. 4 is a schematic plane view illustrating the electroluminescent display device according to the first embodiment of the present disclosure.

FIG. 4 is a schematic plane view illustrating the electroluminescent display device according to the first embodiment of the present disclosure.

As illustrated in FIG. 4, the emission layer 142 and the second electrode 143 of the electroluminescent display device 100 (of FIG. 3) according to the first embodiment of the present disclosure may be disposed in shapes which follow the morphology of the top surface of the first electrode 141.

In this case, the first electrode 141 may include a plurality of holes H.

Each of the plurality of holes H may have a hexagonal shape in plane view, but embodiments are not limited thereto. Each of the plurality of holes H may have various other shapes, such as a semicircular shape, a semielliptical shape, a quadrilateral shape, and a circular shape, in plane view.

An area of each of the plurality of holes H may progressively increase from the bottom surface to the top surface of the first electrode 141.

Accordingly, connecting portions CP each including a first inclined surface “a” and a second inclined surface “b” may be disposed between neighboring holes H.

The connecting portions CP may be disposed at a distance d equal to a width of a bottom surface of the hole H, and a width w of the connecting portion CP may be narrower than the distance d.

The shape of the plurality of holes H of the first electrode 141 may be formed through a process such as photolithography, wet etching, and dry etching. The morphology of the holes H of the first electrode 141 may be adjusted by adjusting a heat treatment process performed in this case.

Figure 5:
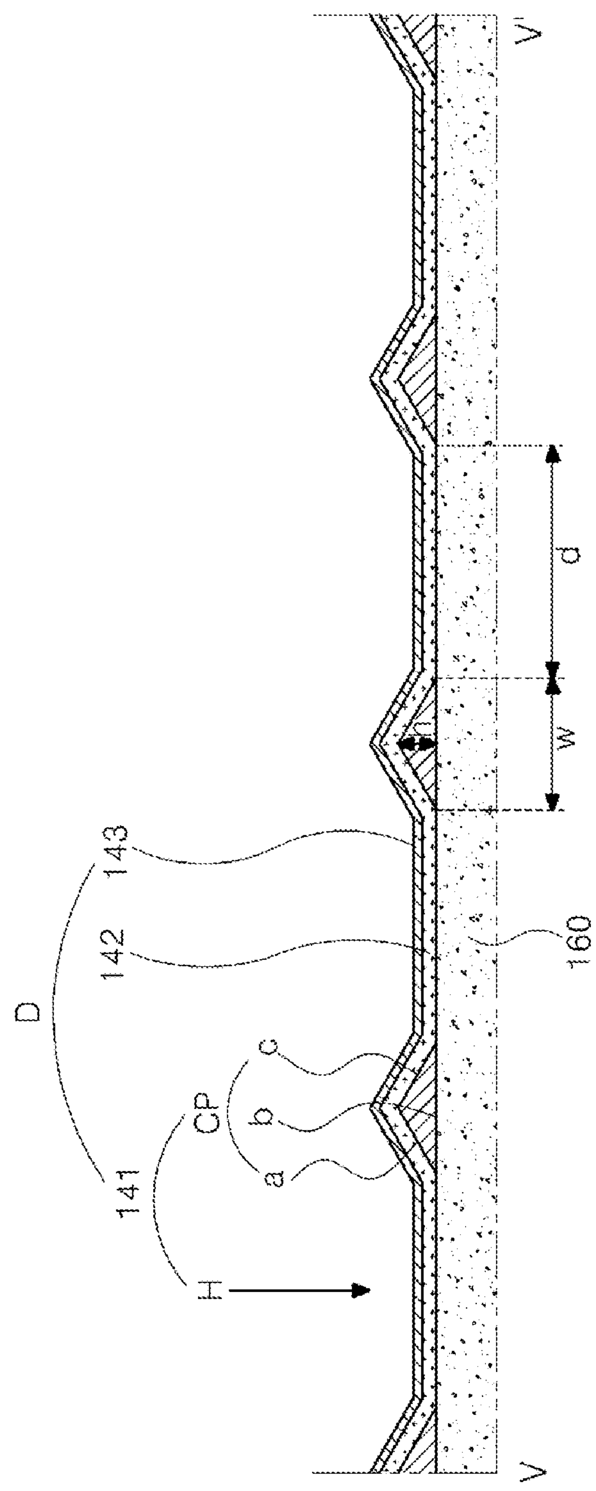
FIG. 5 is a schematic cross-sectional view taken along line V-V' of FIG. 4 according to the first embodiment of the present disclosure.

FIG. 5 is a schematic cross-sectional view taken along line V-V' of FIG. 4.

As illustrated in FIG. 5, the light emitting diode D including the first electrode 141, the emission layer 142, and the second electrode 143 may be disposed on the overcoat layer 160.

In this case, the first electrode 141 may include a plurality of holes H and connecting portions CP.

Each of the plurality of holes H may be formed to pass through the bottom surface and the top surface of the first electrode 141.

An area of each of the plurality of holes H may progressively increase from the bottom surface to the top surface of the first electrode 141.

Accordingly, connecting portions CP each having a triangular cross-section may be disposed between neighboring holes H.

Each of the connecting portions CP may include an undersurface “c” and first and second inclined surfaces “a” and “b” which are connected to the undersurface “c.”

The connecting portions CP may be spaced apart at a predetermined distance. A distance d between the connecting portions CP (the distance d corresponds to a width of a bottom surface of the hole) may have a larger value than a width w of each of the connecting portions CP (The width w corresponds to a length of the undersurface of the connecting portion).

For example, the width w of the connecting portion CP may be in the range of 2.5 μm to 3 μm, and the distance d between the plurality of connecting portions CP may be in the range of 4 μm to 5 μm, but embodiments are not limited thereto.

A height h of the connecting portion CP may be in the range of 0.7 μm to 0.8 μm, but embodiments are not limited thereto.

Figure 6:
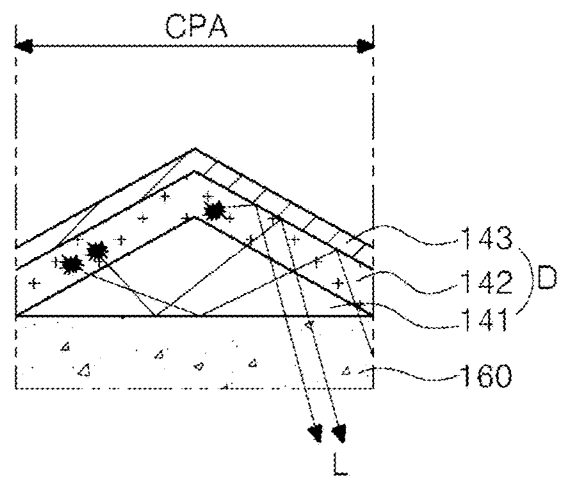
FIG. 6 is a schematic view illustrating an optical path in a connecting portion area of the electroluminescent display device according to the first embodiment of the present disclosure.

FIG. 6 is a schematic view illustrating an optical path in a connecting portion area of the electroluminescent display device according to the first embodiment of the present disclosure.

As illustrated in FIG. 6, in a connecting portion area CPA, light L, which has been totally reflected inside the first electrode 141 and the emission layer 142 and is unable to be output to the outside among light L emitted from the emission layer 142, is re-reflected at the second electrode 143 disposed corresponding to an inclined surface “a” of a connecting portion CP and is extracted to the outside. In this way, the light extraction efficiency may be improved.

Figure 7A:
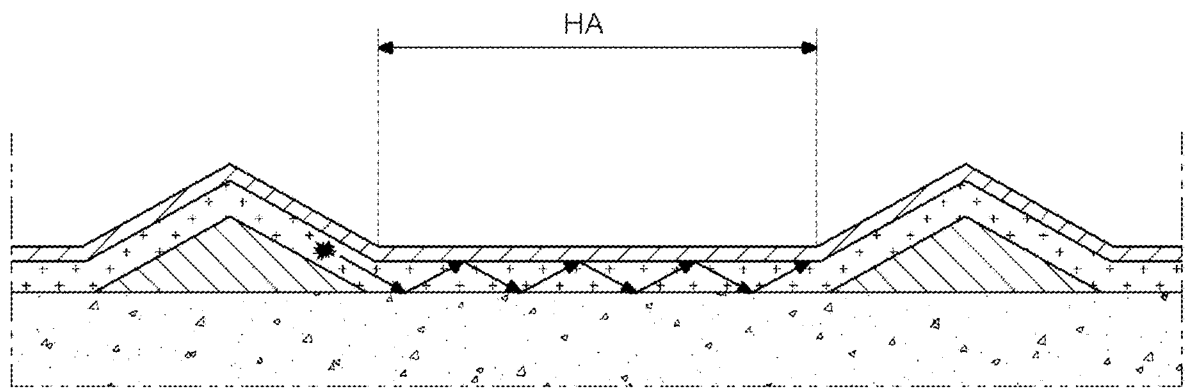
FIG. 7A is a schematic view illustrating an optical path in a hole area of the electroluminescent display device according to the first embodiment of the present disclosure.
Figure 7B:
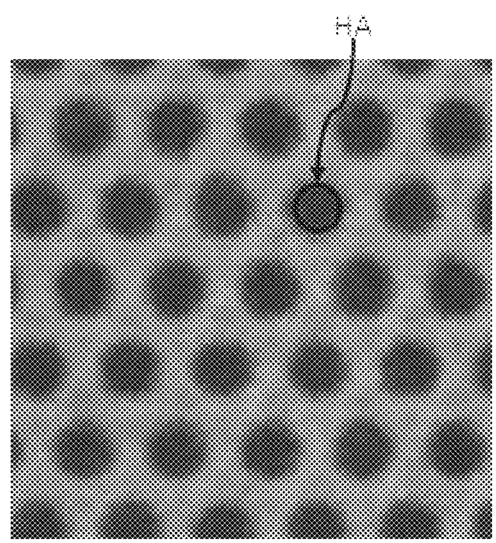
FIG. 7B is a picture in which a black area is observed from the hole area of the electroluminescent display device according to the first embodiment of the present disclosure.

FIG. 7A is a schematic view illustrating an optical path in a hole area of the electroluminescent display device according to the first embodiment of the present disclosure, and FIG. 7B is a picture in which a black area is observed from the hole area of the electroluminescent display device according to the first embodiment of the present disclosure. Description will be given with reference to FIGS. 5, 7A, and 7B.

As illustrated in FIG. 7A, light L emitted from the emission layer 142 is unable to be emitted to the outside from an area disposed between the spaced-apart connecting portions CP of the first electrode 141, that is, a hole area HA, and is, instead, totally reflected and travels inside the emission layer 142.

Accordingly, as illustrated in FIG. 7B, there is a problem in that the hole area HA is observed as a black area.

As described above, although the plurality of holes H are formed in the first electrode 141 so that the light extraction efficiency of connecting portion areas CPA between the plurality of holes H may be improved in the electroluminescent display device 100 according to the first embodiment of the present disclosure, there is a problem in that the hole area HA is observed as a black area.

Hereinafter, description will be given, according to second and third embodiments, on an electroluminescent display device in which light extraction efficiency of an area in which a hole is formed as well as light extraction efficiency of a connecting portion area between a plurality of holes are improved so that a problem, wherein the area in which a hole is formed is observed as a black area, is prevented.

Figure 8:
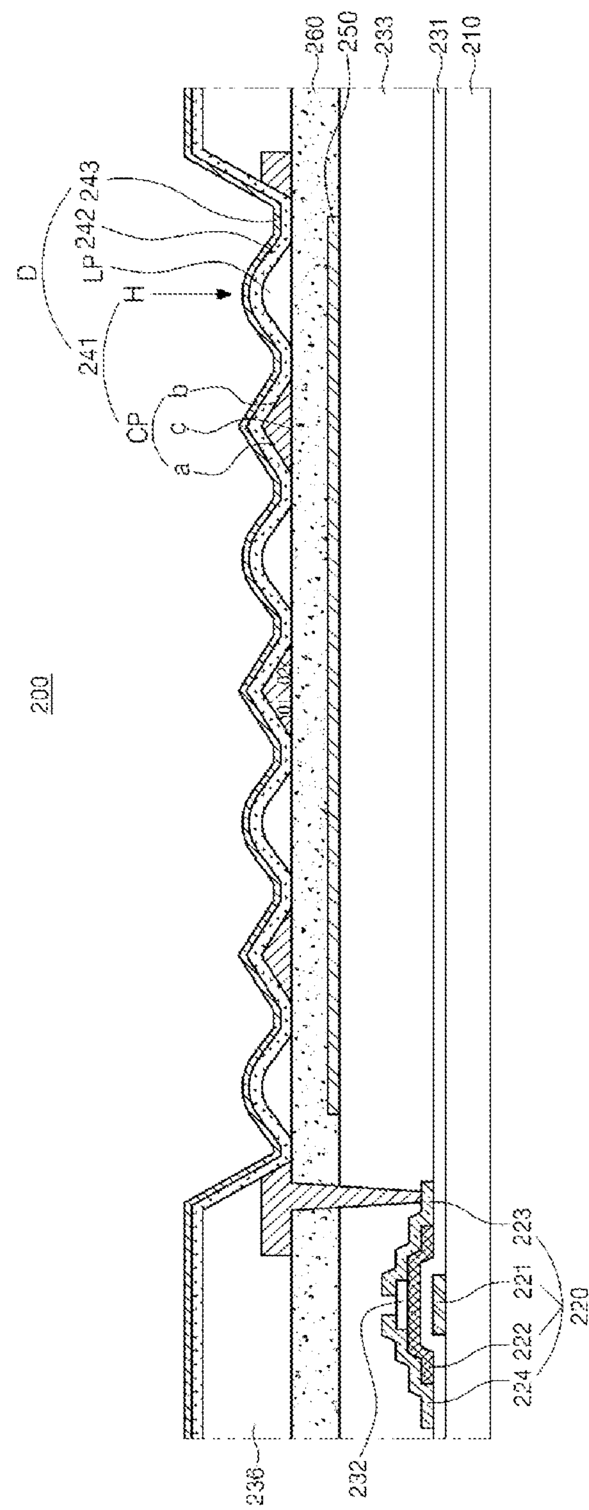
FIG. 8 is a schematic cross-sectional view illustrating an electroluminescent display device according to a second embodiment of the present disclosure.

FIG. 8 is a schematic cross-sectional view illustrating an electroluminescent display device according to a second embodiment of the present disclosure.

As illustrated in FIG. 8, an electroluminescent display device 200 according to the second embodiment of the present disclosure may include a substrate 210, a thin film transistor 220, a color filter pattern 250, an overcoat layer 260, and a light emitting diode D electrically connected to the thin film transistor 220.

The electroluminescent display device 200 according to the second embodiment of the present disclosure is illustrated as being a bottom emission type in which light from an emission layer 242 is output to the outside through a first electrode 241, but embodiments are not limited thereto.

That is, the electroluminescent display device 200 according to the second embodiment of the present disclosure may also be a top emission type in which the color filter pattern 250 is located opposite the substrate 210 and light from the emission layer 242 is output to the outside through a second electrode 243.

When the electroluminescent display device 200 is the top emission type, a reflective electrode or a reflective layer may be further formed below the first electrode 241. For example, the reflective electrode or the reflective layer may be formed of an APC alloy. In this case, the second electrode 243 may have a relatively small thickness for light to transmit therethrough.

The electroluminescent display device 200 according to the second embodiment of the present disclosure may include, on the substrate 210, a thin film transistor 220 which includes a gate electrode 221, an active layer 222, a source electrode 223, and a drain electrode 224.

Specifically, the gate electrode 221 of the thin film transistor 220 and a gate insulating layer 231 may be disposed on the substrate 210.

The active layer 222, which overlaps the gate electrode 221, may be disposed on the gate insulating layer 231.

An etch stopper 232 for protecting a channel area of the active layer 222 may be disposed on the active layer 222.

The source electrode 223 and the drain electrode 224, which come into contact with the active layer 222, may be disposed on the active layer 222.

The electroluminescent display device 200 to which the second embodiment of the present disclosure is applicable is not limited to that illustrated in FIG. 8. The electroluminescent display device 200 may further include a buffer layer disposed between the substrate 210 and the active layer 222, and the etch stopper 232 may not be disposed thereon.

For convenience of description, only the driving thin film transistor has been illustrated from among various thin film transistors that may be included in the electroluminescent display device 200. Although the thin film transistors 220 will be described as having an inverted staggered structure or bottom gate structure in which, with respect to the active layer 222, the gate electrode 221 is disposed opposite the source electrode 223 and the drain electrode 224, this is merely an example, and a thin film transistor, which has a coplanar structure or top gate structure in which, with respect to the active layer 222, the gate electrode 221 is disposed to be collinear with the source electrode 223 and the drain electrode 224, may also be used.

A protective layer 233 may be disposed on the drain electrode 224 and the source electrode 223, and the color filter pattern 250 may be disposed above the protective layer 233.

The protective layer 233 is illustrated to have a flat top surface. Alternatively, the protective layer 233 may also be disposed along the shapes of surfaces of configurations located below the protective layer 233.

The color filter pattern 250 is configured to change a color of light emitted from the emission layer 242, and may be one of a red color filter pattern, a green color filter pattern, and a blue color filter pattern.

The color filter pattern 250 may be disposed at positions which correspond to an emission area and may be disposed only at portions of the emission area.

Emission area refers to an area in which the emission layer 242 emits light by the first electrode 241 and the second electrode 243, and the color filter pattern 250 being disposed at a position corresponding to the emission area means that the color filter pattern 250 is disposed to prevent a blurring phenomenon and a ghost phenomenon which occur due to mixing of light emitted from adjacent emission areas.

For example, the color filter pattern 250 may be disposed to overlap the emission area and have a size smaller than or equal to that of the emission area.

However, the arrangement position and size of the color filter pattern 250 may be determined by various factors such as a distance between the color filter pattern 250 and the first electrode 241, a distance between the color filter pattern 250 and the overcoat layer 260, and a distance between the emission area and a non-emission area, as well as the size and position of the emission area.

A pixel of the present disclosure may include one or more subpixels. For example, a single pixel may include two to four subpixels.

Subpixel refers to a unit in which a specific type of color filter pattern 250 is formed or in which the light emitting diode D is capable of emitting a particular color without the color filter pattern 250.

Colors defined in a subpixel may include red (R), green (G), blue (B), and optionally white (W), but embodiments are not limited thereto.

The overcoat layer 260 may be disposed on the color filter pattern 250 and the protective layer 233.

The protective layer 233 may be omitted. That is, the overcoat layer 260 may be disposed on the thin film transistor 220.

The color filter pattern 250 is illustrated as being disposed on the protective layer 233, but embodiments are not limited thereto. The color filter pattern 250 may be disposed at any position between the overcoat layer 260 and the substrate 210.

The light emitting diode D including the first electrode 241, a light extraction pattern LP, the emission layer 242, and the second electrode 243 may be disposed on the overcoat layer 260.

The first electrode 241 of the electroluminescent display device 200 according to the second embodiment of the present disclosure may include a plurality of holes H configured to expose the overcoat layer 260.

That is, the first electrode 241 may include a bottom surface which comes into contact with the overcoat layer 260 and a top surface which is disposed opposite the bottom surface.

Each of the plurality of holes H may be formed to pass through the bottom surface and the top surface of the first electrode 241.

An area of each of the plurality of holes H may progressively increase from the bottom surface to the top surface of the first electrode 241. Namely, each of the plurality of holes H has an upper portion and a lower portion, and an area of the upper portion is greater than that of the lower portion.

Accordingly, connecting portions CP each having a triangular cross-section may be disposed between neighboring holes H.

Each of the connecting portions CP may include an undersurface "c" and first and second inclined surfaces "a" and "b" which are connected to the undersurface "c."

A first angle $\theta 1$ formed between the undersurface "c" and the first inclined surface "a" and a second angle $\theta 2$ formed between the undersurface "c" and the second inclined surface "b" may be equal to each other, but embodiments are not limited thereto. The first angle $\theta 1$ and the second angle $\theta 2$ may also be different from each other.

In this case, when the first angle $\theta 1$ and the second angle $\theta 2$ are less than 15°, the light extraction efficiency may be low, and when the first angle $\theta 1$ and the second angle $\theta 2$ exceed 70°, an angle at which light, which begins to travel from a valid emission area, travels is 42° or larger such that the light is trapped inside the light emitting diode D and the light extraction efficiency cannot be improved. Therefore, the first angle $\theta 1$ and the second angle $\theta 2$ may be in the range of 15° to 70°.

To block the spread of outgassing from the overcoat layer 260 to the light emitting diode D, a second protective layer (not shown) which has an insulating property may be disposed between the overcoat layer 260 and the first electrode 241.

In this case, the first electrode 241 may be an anode or cathode for supplying one of electrons or holes to the emission layer 242.

A case in which the first electrode 241 of the electroluminescent display device 200 according to the second embodiment of the present disclosure is an anode will be described as an example.

The first electrode 241 may be formed of an amorphous metal oxide. For example, the amorphous metal oxide may include any one selected from the group consisting of IZO, ZTO, $SnO_2$, ZnO, $In_2O_3$, GITO, IGZO, ZITO, IGO, $Ga_2O_3$, AZO, and GZO.

The first electrode 241 may be connected to the source electrode 223 of the thin film transistor 220 through a contact hole formed in the overcoat layer 260 and may be separately formed in each pixel region.

In the electroluminescent display device 200 according to the second embodiment of the present disclosure, the thin film transistor 220 is an N-type thin film transistor in which the first electrode 241 is connected to the source electrode 223, but embodiments are not limited thereto. When the thin film transistor 220 is a P-type thin film transistor, the first electrode 241 may also be connected to the drain electrode 224.

The first electrode 241 may also be electrically connected to the emitting layer 242 by being adjacent to the emitting layer 242 with a conductive material therebetween.

A bank layer 236 may be disposed on the overcoat layer 260 and the first electrode 241.

The bank layer 236 may include an opening configured to expose the first electrode 241.

The bank layer 236 may be disposed between adjacent pixel (or subpixel) areas and serve to differentiate the adjacent pixel (or subpixel) areas.

The bank layer 236 may be formed of a photo acrylic organic material, but embodiments are not limited thereto.

The electroluminescent display device 200 according to the second embodiment of the present disclosure may include a mound shaped (or an island shape) light extraction pattern LP disposed on the overcoat layer 260 exposed by the plurality of holes H.

That is, the light extraction pattern LP may be formed in the plurality of holes H formed in the first electrode 241.

For example, the light extraction pattern LP may be formed in each of the plurality of holes H of the first electrode 241, or the light extraction pattern LP may be formed in some of the plurality of holes H.

Consequently, in a cross-sectional view, the light extraction patterns LP and the connecting portions CP may be alternately disposed in the emission area of the electroluminescent display device 200.

Accordingly, the light extraction patterns LP allow light L (of FIG. 6), which is trapped in areas of holes H instead of being output to the outside, to be extracted to the outside so that the areas of the holes H are prevented from being observed as black areas.

The light extraction patterns LP and the bank layer 236 may be disposed on the same layer and formed of the same material.

That is, the light extraction patterns LP may be formed in the holes H of the first electrode 241 by using a process of forming the bank layer 236 without a separate process. Therefore, a separate process is not required. For example, a half-tone mask may be used to form the bank layer 236 and the light extraction patterns LP.

The light extraction patterns LP will be described in more detail below.

The emission layer 242 may be disposed on the first electrode 241, the light extraction patterns LP, the overcoat layer 260, and the bank layer 236.

The emission layer 242 may have a tandem white structure in which a plurality of emission layers are stacked to emit white light.

For example, the emission layer 242 may include a first emission layer configured to emit blue light and a second emission layer disposed on the first emission layer and configured to emit light having a color which turns white when mixed with blue.

The second emission layer may be an emission layer configured to emit yellow-green light.

The emission layer 242 may only include emission layers that emit one of blue light, red light, and green light. In this case, the electroluminescent display device 200 may not include the color filter pattern 250.

In this case, an emitting material of the emitting layer 242 may be an organic emitting material or an inorganic emitting material, such as a quantum dot.

Also, the emission layer 242 may be disposed along the shapes of the first electrode 241, the light extraction patterns LP, and the overcoat layer 260.

That is, the emission layer 242 may be disposed along the shapes of the first electrode 241 including the plurality of holes H and the light extraction patterns LP formed in the plurality of holes H.

The second electrode 243 for supplying one of electrons or holes to the emission layer 242 may be disposed on the emission layer 242.

In this case, the second electrode 243 may be an anode or a cathode.

A case in which the second electrode 243 of the electroluminescent display device 200 according to the second embodiment of the present disclosure is a cathode will be described as an example.

The second electrode 243 may be formed of a conductive material having a relatively low work function value and may be located on an entire surface of a display area. For example, the second electrode 243 may be formed of Al, Mg, Ag, or an alloy thereof, but embodiments are not limited thereto.

The second electrode 243 is disposed in a shape which follows the morphology of the emission layer 242.

The first electrode 241, the light extraction patterns LP, the emission layer 242, and the second electrode 243 form the light emitting diode D, and the light emitting diode D follows the morphology of the connecting portions CP, the holes H, the light extraction patterns LP formed in the holes H of first electrode.

That is, the emission layer 242 and the second electrode 243 are disposed in shapes which follow the morphology of the top surfaces of the first electrode 241 and the light extraction patterns LP.

In this way, the shape of the light emitting diode D may be realized using the plurality of holes H, the connecting portions CP, and the light extraction patterns LP formed in the plurality of holes H of the first electrode 241.

Figure 9:
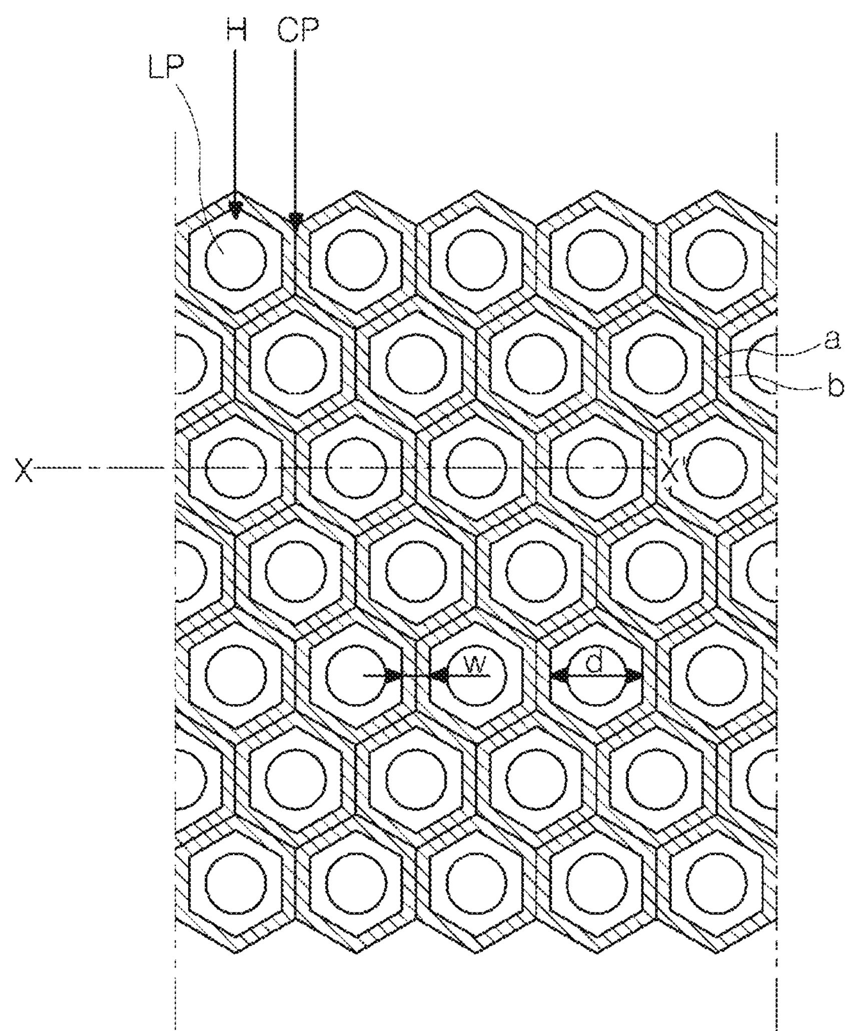
FIG. 9 is a schematic plane view the electroluminescent display device according to the second embodiment of the present disclosure.

FIG. 9 is a schematic plane view illustrating the electroluminescent display device according to the second embodiment of the present disclosure.

As illustrated in FIG. 9, the emission layer 242 and the second electrode 243 of the electroluminescent display device 200 (of FIG. 8) according to the second embodiment of the present disclosure may be disposed in shapes which follow the morphology of the top surfaces of the first electrode 241 and the light extraction patterns LP.

In this case, the first electrode 241 may include a plurality of holes H.

Each of the plurality of holes H may have a hexagonal shape in plane view, but embodiments are not limited thereto. Each of the plurality of holes H may have various other shapes, such as a semicircular shape, a semielliptical shape, a quadrilateral shape, and a circular shape, in plane view.

An area of each of the plurality of holes H may progressively increase from the bottom surface to the top surface of the first electrode 241.

Accordingly, connecting portions CP each including a first inclined surface "a" and a second inclined surface "b" may be disposed between neighboring holes H.

The connecting portions CP may be disposed at a distance d equal to a width of a bottom surface of the hole H, and a width w of the connecting portion CP may be narrower than the distance d.

The shape of the plurality of holes H of the first electrode 241 may be formed through a process such as photolithography, wet etching, and dry etching. The morphology of the holes H of the first electrode 241 may be adjusted by adjusting a heat treatment process performed in this case.

Particularly, mound shaped light extraction patterns LP may be disposed on the overcoat layer 260.

In this case, the light extraction patterns LP may have a circular shape in plane view, but embodiments are not limited thereto. The light extraction patterns LP may also have various other shapes, such as a semicircular shape, a semielliptical shape, a quadrilateral shape, and a hexagonal shape, in plane view.

Each light extraction pattern LP may have a smaller size than each hole H.

Accordingly, the overcoat layer 260 (of FIG. 8) may be exposed between the connecting portions CP and the light extraction patterns LP. Namely, the light extraction pattern LP has an area being smaller than the hole H such that the overcoat layer 260 between the first electrode 241, i.e., the connecting portion CP and the light extraction pattern LP is exposed. In this instance, the emitting layer 242 may contact the overcoat layer 260 between the first electrode 241, i.e., the connecting portion CP and the light extraction pattern LP.

The light extraction patterns LP are illustrated as being respectively formed in the plurality of holes H of the first electrode 241, but embodiments are not limited thereto. The light extraction patterns LP may also be formed in only some of the plurality of holes H.

Figure 10:
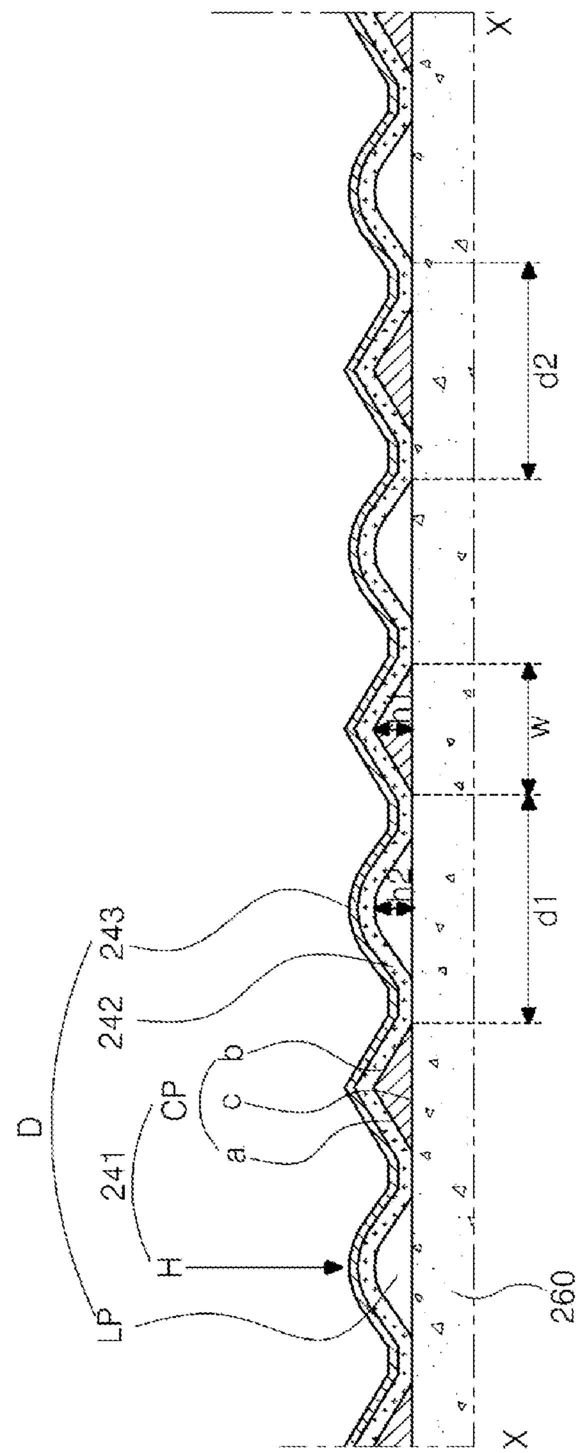
FIG. 10 is a cross-sectional view taken along line X-X' of FIG. 9 according to the second embodiment of the present disclosure.

FIG. 10 is a cross-sectional view taken along line X-X' of FIG. 9 according to the second embodiment of the present disclosure. Description will be given with reference to FIGS. 9 and 10.

As illustrated in FIG. 10, the light emitting diode D including the first electrode 241, light extraction pattern LP, the emission layer 242, and the second electrode 243 may be disposed on the overcoat layer 260.

The first electrode 241 may include a plurality of holes H and connecting portions CP.

Each of the plurality of holes H may be formed to pass through the bottom surface and the top surface of the first electrode 241.

An area of each of the plurality of holes H may progressively increase from the bottom surface to the top surface of the first electrode 241.

Accordingly, connecting portions CP each having a triangular cross-section may be disposed between neighboring holes H.

Each of the connecting portions CP may include an undersurface "c" and first and second inclined surfaces "a" and "b" which are connected to the undersurface "c."

The connecting portions CP may be spaced apart at a predetermined distance.

That is, a distance d1 between the connecting portions CP (the distance d1 corresponds to a width of a bottom surface of the hole) may have a larger value than a width w of each of the connecting portions CP (the width w corresponds to a length of the undersurface of the connecting portion).

For example, the width w of the connecting portion CP may be in the range of 2.5 μm to 3 μm, and the distance d1 between the plurality of connecting portions CP may be in the range of 4 μm to 5 μm, but embodiments are not limited thereto.

A height h1 of the connecting portion CP may be in the range of 0.7 μm to 0.8 μm, but embodiments are not limited thereto.

Particularly, the light emitting diode D of the electroluminescent display device 200 (of FIG. 8) according to the second embodiment of the present disclosure may include a mound shaped light extraction pattern LP disposed on the overcoat layer 260 exposed by the plurality of holes H.

That is, the light extraction pattern LP may be formed in the plurality of holes H formed in the first electrode 241.

For example, the light extraction pattern LP may be formed in each of the plurality of holes H of the first electrode 241, or the light extraction pattern LP may be formed in some of the plurality of holes H.

That is, the light extraction pattern LP may be disposed in each of the plurality of holes H, which are partial non-emissive portions in which the first electrode 241 is not formed.

Consequently, in a cross-sectional view, the light extraction patterns LP and the connecting portions CP may be alternately disposed in the electroluminescent display device 200.

Accordingly, light emitted from areas of the connecting portions CP may be output to the outside through the light extraction patterns LP.

That is, in the areas of connecting portions CP, light L1, which has been totally reflected and trapped inside the first electrode 241 and the emission layer 242, may be extracted to the outside using the inclined surfaces of the connecting portions CP, and light may be re-extracted to the outside through scattering in areas in which the light extraction patterns, which are disposed in areas of the holes H, are formed.

In this case, the light extraction pattern LP may have a circular shape in plane view, and an area of the circular shape may have a smaller value than an area of each of the plurality of holes H formed in the first electrode 241.

However, the shape of the light extraction pattern LP in plane view is not limited to a circular shape, and may be various other shapes such as a polygonal shape.

The plurality of light extraction patterns LP may be spaced apart from each other at a distance d2 in the range of 4 μm to 4.5 μm, but embodiments are not limited thereto.

A height h2 of each of the plurality of light extraction pattern LP may be in the range of 0.7 μm to 1 μm, but embodiments are not limited thereto. Namely, the height h2 of the light extraction pattern LP may be greater than or equal to the height h1 of the connecting portion CP. In other words, the height h2 of the light extraction pattern LP may be greater than or equal to a depth, i.e., the height h1 of the connecting portion CP, of the hole H in the first electrode 241.

The light extraction patterns LP and the bank layer 236 may be disposed on the same layer and formed of the same material.

That is, the light extraction patterns LP may be formed in the holes H of the first electrode 241 by using a process of forming the bank layer 236 without a separate process. Therefore, a separate process is not required. For example, a half-tone mask may be used to form the bank layer 236 and the light extraction patterns LP.

Figure 11:
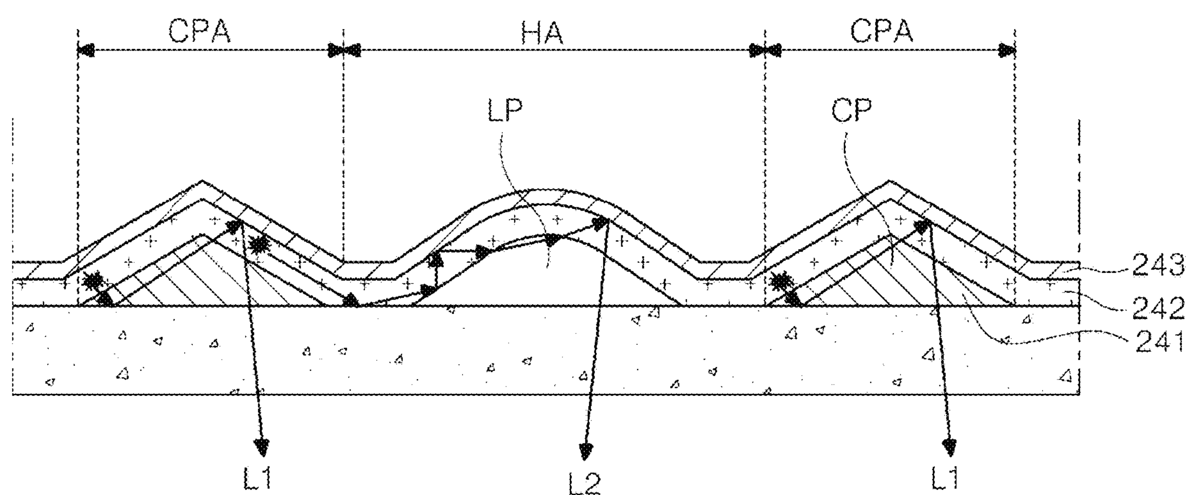
FIG. 11 is a schematic view illustrating an optical path of the electroluminescent display device according to the second embodiment of the present disclosure.
Figure 12:
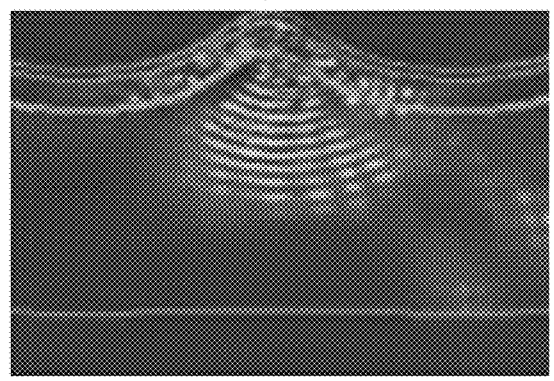
FIG. 12 is a picture which shows an output of light from the electroluminescent display device according to the second embodiment of the present disclosure.

FIG. 11 is a schematic view illustrating an optical path of the electroluminescent display device according to the second embodiment of the present disclosure, and FIG. 12 is a picture which shows an output of light from the electroluminescent display device according to the second embodiment of the present disclosure. Description will be given with reference to FIGS. 10, 11, and 12.

As illustrated in FIG. 11, in a connecting portion area CPA of the electroluminescent display device 200 (of FIG. 8) according to the second embodiment of the present disclosure, light L1, which has been totally reflected and trapped inside the first electrode 241 and the emission layer 242, may be re-reflected at the second electrode 243, which is disposed corresponding to an inclined surface of a connecting portion CP, to allow the light L1 to be extracted to the outside. In this way, the light extraction efficiency may be improved.

Further, referring additionally to FIG. 12, in a hole area HA, light L2, which has been totally reflected and trapped inside the emission layer 242, may be re-reflected through the light extraction pattern LP and the second electrode 243 to allow the light L2 to be extracted to the outside. In this way, the light extraction efficiency may be further improved, and a black area may be effectively prevented from being observed from the hole area HA.

Hereinafter, detailed description of configurations identical or similar to those of the second embodiment may be omitted.

Figure 13:
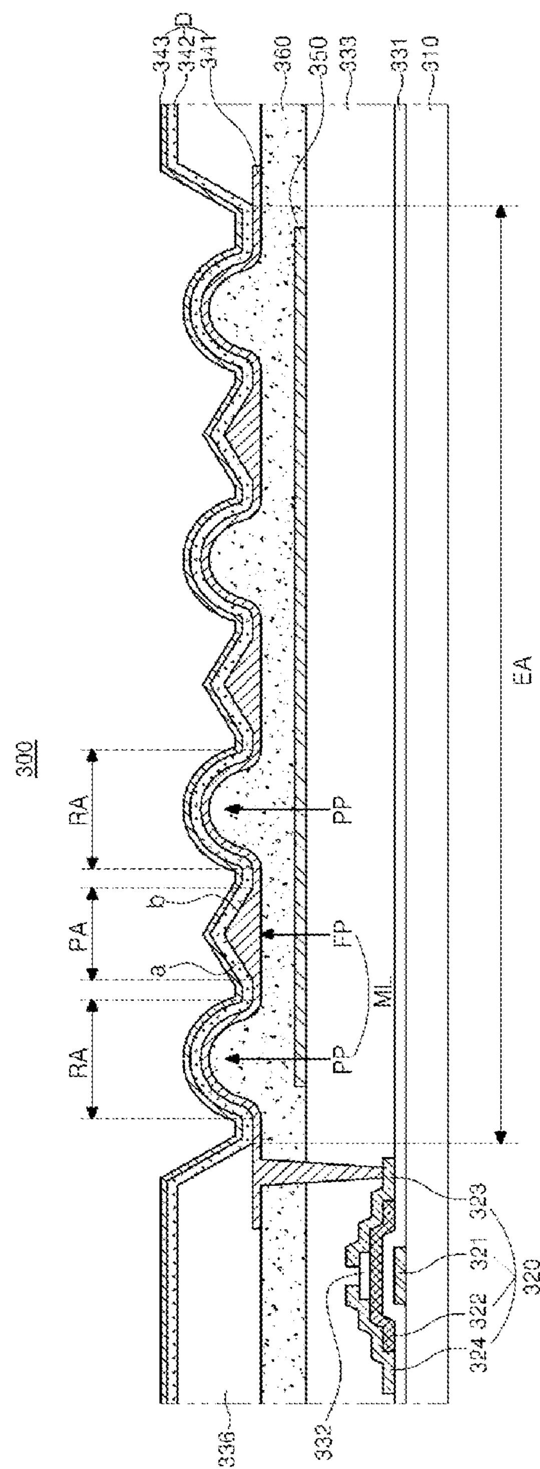
FIG. 13 is a schematic cross-sectional view illustrating an electroluminescent display device according to a third embodiment of the present disclosure.

FIG. 13 is a schematic cross-sectional view illustrating an electroluminescent display device according to a third embodiment of the present disclosure.

As illustrated in FIG. 13, an electroluminescent display device 300 according to the third embodiment of the present disclosure includes a substrate 310, a thin film transistor 320, a color filter pattern 350, an overcoat layer 360, and a light emitting diode D electrically connected to the thin film transistor 320.

Specifically, a gate electrode 321 of the thin film transistor 320 and a gate insulating layer 331 may be disposed on the substrate 310.

An active layer 322 which overlaps the gate electrode 321 may be disposed on the gate insulating layer 331.

An etch stopper 332 for protecting a channel area of the active layer 322 may be disposed on the active layer 322.

A source electrode 323 and a drain electrode 324, which come into contact with the active layer 322, may be disposed on the active layer 322.

A protective layer 333 may be disposed on the drain electrode 324 and the source electrode 323, and the color filter pattern 350 may be disposed above the protective layer 333.

In this case, the overcoat layer 360 may be disposed on the color filter pattern 350 and the protective layer 333.

Particularly, to improve the light extraction efficiency, the electroluminescent display device 300 according to the third embodiment of the present disclosure may include a micro lens (micro-lens structure) ML disposed in the overcoat layer 360 which corresponds to an emission area EA.

In this case, the micro lens ML may include a plurality of protruding portions PP.

That is, in the overcoat layer 360 which corresponds to the emission area EA, a micro lens ML which includes a plurality of protruding portions PP and flat portions FP configured to connect adjacent protruding portions PP may be formed.

However, embodiments are not limited thereto, and the micro lens ML may have various other forms. For example, recessed portions may be formed between the plurality of protruding portions PP.

The overcoat layer 360 may have a flat top surface in a non-emission area.

In this case, each of the plurality of protruding portions PP may have various shapes, such as a hexagonal shape, a semicircular shape, a semielliptical shape, and a quadrilateral shape, in plane view.

To form the plurality of protruding portions PP at the overcoat layer 360 corresponding to the emission area EA, a photoresist is applied, patterning is performed through a photolithography process, and then a heat treatment is performed.

The light emitting diode D which includes a first electrode 341, an emission layer 342, and a second electrode 343 may be disposed on the overcoat layer 360.

In this case, the first electrode 341 may include a plurality of round portions RA and a plurality of pattern portions PA.

The first electrode 341 is disposed along the morphology of a surface of the overcoat layer 360.

That is, the first electrode 341 may be disposed in the form which follows the morphology of the plurality of protruding portions PP of the overcoat layer 360 exactly.

Accordingly, the plurality of round portions RA may be formed to correspond to the plurality of protruding portions PP of the overcoat layer 360 respectively.

The pattern portions PA may be formed between the plurality of round portions RA.

The pattern portions PA may have a triangular cross-section, but embodiments are not limited thereto.

In the electroluminescent display device 300 according to the third embodiment of the present disclosure, the plurality of round portions RA, which have a convex shape corresponding to the protruding portions PP of the overcoat layer 360, and the plurality of pattern portions PA, which are formed at the flat portions FP of the overcoat layer 360 and protrude in a triangular shape in cross-sectional view, may be alternately disposed.

In this case, the pattern portion PA may have first and second inclined surfaces "a" and "b."

The first electrode 341 including the round portions RA and the pattern portions PA may be formed of an amorphous metal oxide. For example, the amorphous metal oxide may include any one selected from the group consisting of IZO, ZTO, $SnO_2$, ZnO, $In_2O_3$, GITO, IGZO, ZITO, IGO, $Ga_2O_3$, AZO, and GZO.

The first electrode 341 may be connected to the source electrode 323 of the thin film transistor 320 through a contact hole formed in the overcoat layer 360 and may be separately formed in each pixel region.

A bank layer 336 may be disposed on the overcoat layer 360 and the first electrode 341.

The bank layer 336 may include an opening configured to expose the first electrode 341.

The bank layer 336 may be disposed between adjacent pixel (or subpixel) areas and serve to differentiate the adjacent pixel (or subpixel) areas.

The plurality of protruding portions PP of the overcoat layer 360 may be disposed at the opening of the bank layer 336.

The emission layer 342 may be disposed on the first electrode 341, and the emission layer 342 may only include emission layers that emit one of blue light, red light, and green light. In this case, the electroluminescent display device 300 may not include the color filter pattern 350.

In this case, an emitting material of the emitting layer 342 may be an organic emitting material or an inorganic emitting material, such as a quantum dot.

Also, the emission layer 342 may be disposed in a shape that follows the morphology of the first electrode 341 in an emission area.

That is, the emission layer 342 may be disposed along the shapes of the first electrode 341 including the round portions RA and the pattern portions PA.

The second electrode 343 may be disposed on the emission layer 342.

The second electrode 343 may be formed of a conductive material having a relatively low work function value and may be located on an entire surface of a display area. For example, the second electrode 343 may be formed of Al, Mg, Ag, or an alloy thereof, but embodiments are not limited thereto.

The second electrode 343 may be disposed in a shape which follows the morphology of the emission layer 342.

In this way, the shape of the light emitting diode D may be realized using the overcoat layer 360 having the plurality of protruding portions PP and the first electrode 341 having the plurality of round portions RA and pattern portions PA.

Figure 14:
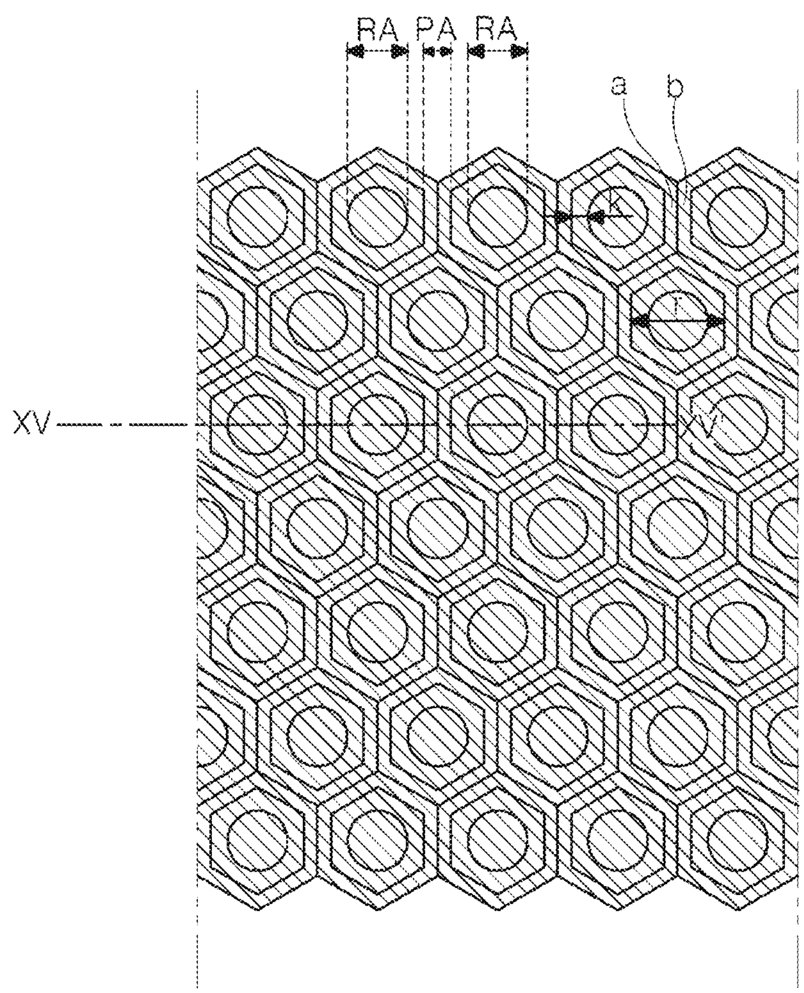
FIG. 14 is a schematic plane view illustrating the electroluminescent display device according to the third embodiment of the present disclosure.

FIG. 14 is a schematic plane view schematically illustrating the electroluminescent display device according to the third embodiment of the present disclosure.

As illustrated in FIG. 14, the emission layer 342 and the second electrode 343 of the electroluminescent display device 300 (of FIG. 13) according to the third embodiment of the present disclosure are disposed in shapes which follow the morphology of the top surface of the first electrode 341.

In this case, the first electrode 341 may include a plurality of round portions RA.

Each of the plurality of round portions RA may have a circular shape in plane view, but embodiments are not limited thereto. Each of the plurality of round portions RA may have various other shapes, such as a semicircular shape, a semielliptical shape, and a quadrilateral shape, in plane view.

The round portions RA of the first electrode 341 may be formed in various ways in accordance with the shape of the protruding portions PP of the overcoat layer 360 disposed below the first electrode 341.

The pattern portions PA each including a first inclined surface "a" and a second inclined surface "b" may be disposed between neighboring round portions RA.

The pattern portion PA may be disposed at a distance k from the round portion RA, but embodiments are not limited thereto. The pattern portion PA and the round portion RA may be disposed without the distance k therebetween.

Figure 15:
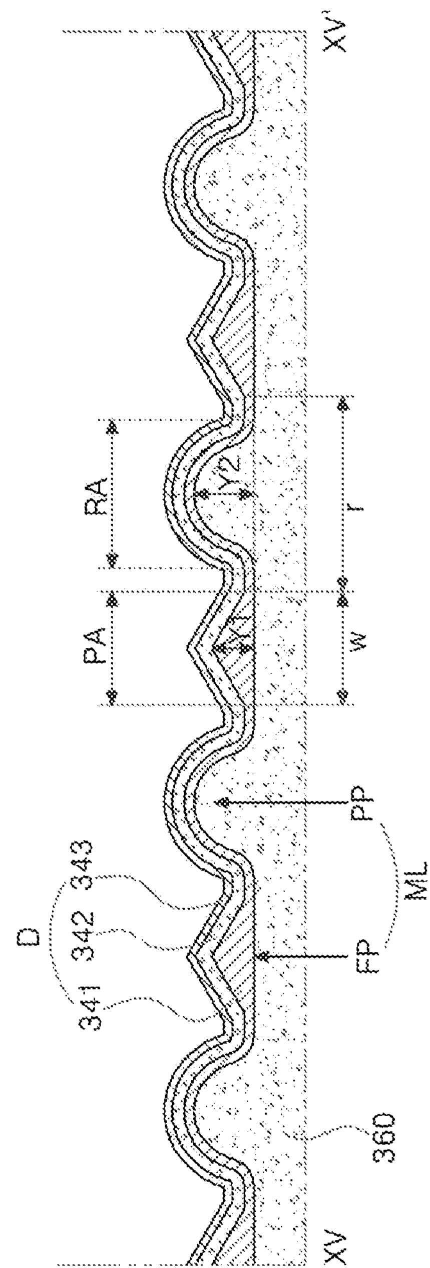
FIG. 15 is a cross-sectional view taken along line XV-XV' of FIG. 14 according to the third embodiment of the present disclosure.

FIG. 15 is a cross-sectional view taken along line XV-XV' of FIG. 14 according to the third embodiment of the present disclosure. Description will be given with reference to FIGS. 13, 14, and 15.

As illustrated in FIG. 15, the light emitting diode D including the first electrode 341, the emission layer 342, and the second electrode 343 may be disposed on the overcoat layer 360.

In this case, the overcoat layer 360, which corresponds to an emission area EA, may include a plurality of protruding portions PP.

The first electrode 341 may include a plurality of round portions RA and a plurality of pattern portions PA.

The pattern portions PA may have a triangular cross-section, but embodiments are not limited thereto.

In the first electrode 341, the plurality of round portions RA, which have a convex shape corresponding to the protruding portions PP of the overcoat layer 360, and the plurality of pattern portions PA, which are formed at flat portions FP of the overcoat layer 360 and protrude in a triangular shape in cross-sectional view, may be alternately disposed. Each of the plurality of round portion RA has a thickness being smaller than each of the plurality of pattern portion PA.

In this case, the pattern portion PA may have first and second inclined surfaces "a" and "b."

The plurality of pattern portions PA may be disposed at a predetermined distance. A distance r between the pattern portions PA may have a greater value than a length of a width of each pattern portion PA.

For example, the width w of the pattern portion PA may be in the range of 2.5 μm to 3 μm, and the distance r between the plurality of pattern portions PA may be in the range of 4 μm to 5 μm, but embodiments are not limited thereto.

A height Y1 of the pattern portion PA may have a smaller value than a height Y2 of the protruding portion PP formed at the overcoat layer 360.

The height Y1 of the pattern portion PA may be in the range of 0.7 μm to 0.8 μm, and the height Y2 of each of the plurality of protruding portions PP may be in a range of 0.9 μm to 1.1 μm, but embodiments are not limited thereto.

Figure 16:
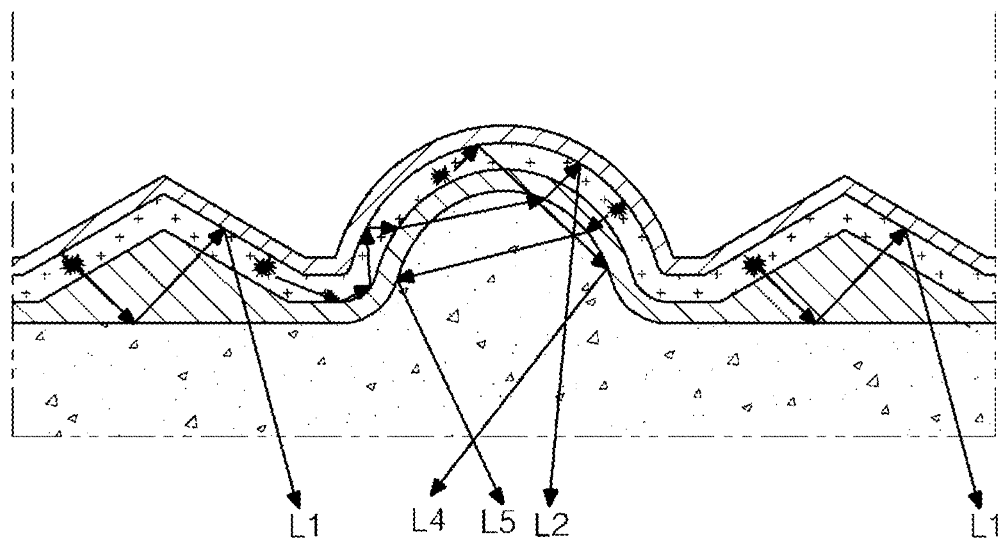
FIG. 16 is a schematic view illustrating an optical path of the electroluminescent display device according to the third embodiment of the present disclosure.

FIG. 16 is a schematic view illustrating an optical path of the electroluminescent display device according to the third embodiment of the present disclosure.

As illustrated in FIG. 16, the electroluminescent display device 300 (of FIG. 13) according to the third embodiment of the present disclosure allows rays of light L1 and L2, which have been totally reflected and trapped inside the emission layer 342 (of FIG. 15), to be uniformly extracted to the outside through the inclined surfaces "a" and "b" (of FIG. 14) of the pattern portion PA (of FIG. 14) and the protruding portion PP (of FIG. 15) of the overcoat layer 360 (of FIG. 15). In this way, the light extraction efficiency may be improved, and occurrence of a black area may be effectively prevented.

Further, since the emission layer 342 above the protruding portion PP also emits light and thus an amount of light being output to the outside through the protruding portion PP further increases (rays of light L4 and L5), the light extraction efficiency may be further improved.

In the present disclosure, a light extraction pattern is disposed in each hole formed in a first electrode, or a first electrode including round portions and pattern portions is disposed so that light trapped in an emission layer can be output. In this way, the light extraction efficiency can be effectively improved.

The present disclosure has been described above with reference to exemplary embodiments thereof. However, those of ordinary skill in the art should understand that various modifications and changes may be made to the present disclosure within the scope not departing from the technical spirit and scope of the present disclosure described in the claims below.

What is claimed is:

1. An electroluminescent display device, comprising:
   an overcoat layer above a substrate including a plurality of subpixel regions;
   a first electrode on the overcoat layer and disposed in each of the plurality of subpixel regions, the first electrode including a plurality of holes exposing the overcoat layer within respective subpixel regions;
   at least one light extraction pattern in at least one of the plurality of holes and on the overcoat layer;
   an emission layer on the first electrode and the at least one light extraction pattern; and
   a second electrode on the emission layer.

2. The electroluminescent display device of claim 1, wherein the at least one light extraction pattern includes a plurality of light extraction patterns disposed at the plurality of holes.

3. The electroluminescent display device according to claim 2, wherein the plurality of light extraction patterns are spaced apart from each other at a distance in a range of 4 μm to 4.5 μm.

4. The electroluminescent display device according to claim 1, further comprising:
   a bank layer on the overcoat layer and covering an edge of the first electrode.

5. The electroluminescent display device according to claim 4, wherein the at least one light extraction pattern and the bank layer are disposed on a same layer and formed of a same material.

6. The electroluminescent display device according to claim 1, wherein a height of the at least one light extraction pattern is greater than or equal to a depth of each of the plurality of holes.

7. The electroluminescent display device according to claim 1, wherein the height of the at least one light extraction pattern is in a range of 0.7 μm to 1 μm.

8. The electroluminescent display device according to claim 1, wherein each of the plurality of holes has an upper portion and a lower portion, and an area of the upper portion is greater than that of the lower portion.

9. An electroluminescent display device, comprising:
   an overcoat layer above a substrate;
   a first electrode on the overcoat layer and including a plurality of holes exposing the overcoat layer;
   at least one light extraction pattern in at least one of the plurality of holes and on the overcoat layer;

an emission layer on the first electrode and the at least one light extraction pattern; and a second electrode on the emission layer, wherein an area of the at least one light extraction pattern is smaller than that of each of the plurality of holes.

10. The electroluminescent display device according to claim 9, wherein the emission layer contacts the overcoat layer between the at least one light extraction pattern and the first electrode.

11. The electroluminescent display device according to claim 1, wherein the at least one light extraction pattern has a circular shape in a plane view.

12. The electroluminescent display device according to claim 1, wherein a plurality of portions of the first electrode surrounding each of the at least one light extraction pattern are electrically connected.

* * * * *